(12) United States Patent
Seeds et al.

(10) Patent No.: US 7,428,254 B2
(45) Date of Patent: Sep. 23, 2008

(54) ATHERMALISATION OF TUNEABLE LASERS

(75) Inventors: Alwyn Seeds, London (GB); Cyril Renaud, London (GB)

(73) Assignee: University College London, London (GB)

( * ) Notice: Subject to any disclaimer, the term of this patent is extended or adjusted under 35 U.S.C. 154(b) by 226 days.

(21) Appl. No.: 10/552,343

(22) PCT Filed: Apr. 13, 2004

(86) PCT No.: PCT/GB2004/001596

§ 371 (c)(1),
(2), (4) Date: Apr. 10, 2003

(87) PCT Pub. No.: WO2005/112209

PCT Pub. Date: Nov. 24, 2005

(65) Prior Publication Data

US 2006/0198406 A1    Sep. 7, 2006

(30) Foreign Application Priority Data

Apr. 10, 2003  (GB) ................................ 0308343.3

(51) Int. Cl.
*H01S 3/13* (2006.01)
*H01S 3/04* (2006.01)
*H01S 3/10* (2006.01)

(52) U.S. Cl. .................... 372/29.02; 372/20; 372/34

(58) Field of Classification Search ............... 372/20, 372/29.02, 29.015, 29.016, 29.023, 34, 38.02, 372/38.07
See application file for complete search history.

(56) References Cited

U.S. PATENT DOCUMENTS

| 5,334,916 | A  | 8/1994  | Noguchi      |
|-----------|----|---------|--------------|
| 6,181,717 | B1 | 1/2001  | Kner et al.  |
| 6,321,003 | B1 | 11/2001 | Kner et al.  |
| 6,327,287 | B1 | 12/2001 | Kner et al.  |
| 2001/0017876 | A1 | 8/2001 | Kner et al. |
| 2003/0007526 | A1 | 1/2003 | Pontis et al. |
| 2003/0138003 | A1 | 7/2003 | Pontis et al. |
| 2003/0142700 | A1 | 7/2003 | Pontis et al. |
| 2003/0142701 | A1 | 7/2003 | Pontis et al. |
| 2003/0142702 | A1 | 7/2003 | Pontis et al. |

FOREIGN PATENT DOCUMENTS

| EP | 0 516 398 A2 | 12/1992 |
| GB | 2 381 121    | 4/2003  |

*Primary Examiner*—Armando Rodriguez
(74) *Attorney, Agent, or Firm*—Wenderoth, Lind & Ponack, L.L.P.

(57) ABSTRACT

This invention describes a technique and apparatus to use any tuneable laser to generate a specified output frequency without controlling its temperature. This technique only involves a thermal sensor and a controller a determine the current(s) of voltage(s) applied to the grating or tuning section(s) to obtain the required wavelength. The control loop can be implemented using a programmed microprocessor, an amplifier and a low pass filter.

24 Claims, 7 Drawing Sheets

ATHERMALISATION OF TUNEABLE LASERS

FIELD OF THE INVENTION

This invention describes a method and system to obtain stable output wavelength from tuneable laser diodes without the use of laser temperature control such as that provided by a thermo electric cooler control (TEC). In more detail, it relates to an apparatus for compensating for the temperature dependence of the wavelength of a semiconductor laser, and the methods for using the apparatus to synthesize exact optical frequencies from a tuneable laser without any temperature control.

BACKGROUND OF THE INVENTION

Fibre optic wavelength division multiple (WDM) telecommunications networks require tuneable sources which can cover all the spectrum allowed. Such sources exist and offer tuneable (by way of example DBR -Distributed Bragg Reflector- or DFB—Distributed Feed Back- laser) or highly tuneable (by way of example SG-DBR -Sampled Grating- or SSG-DBR -Super Structure Grating-) output, however WDM applications require sources having good stability in wavelength. In current practice, this is provided by temperature control since the main cause of wavelength drift is variation in laser temperature as tuneable laser output wavelength is temperature dependent (typical coefficient: 0.1 nm/degree). The temperature is usually controlled by means of a Peltier-effect thermoelectric cooler. Such devices consume up to 10 W of electrical power compared to an order of 0.2 W consumed by the laser. In large WDM systems with 50-200 channels the resultant prime power and cooling requirements are onerous. Furthermore, as laser diode operating temperature ranges are increased to from 0 to 85 degrees C., coolerless operation becomes very attractive for reduced power consumption and cost and increased reliability.

SUMMARY OF THE INVENTION

In its broadest independent aspect, the invention provides a tuneable laser apparatus comprising a tuneable laser, a thermal sensor and a controller, characterised in that said controller controls at least one or a combination of the following variables: the currents, the voltages, a tuning section and a phase section. Moreover, the controller incorporates means which adjust any appropriate one or combination of these variables taking into account the laser's output wavelength dependency on temperature and section currents/voltage, whereby the output wavelength may be kept at the desired operating value without any significant mode jump, regardless of the temperature of operation within the laser's operative range.

In a subsidiary aspect in accordance with the invention's broadest aspect, the apparatus comprises no closed loop laser temperature control means.

In a further subsidiary aspect, the apparatus further comprises a low pass filter for removing rapidly changing signals in the control currents or voltages.

In a further subsidiary aspect, the laser is a Distributed Bragg Reflector (DBR) tuneable laser diode.

In a further subsidiary aspect, the laser is a Distributed Feed Back (DFB) tuneable laser diode.

In a further subsidiary aspect, the laser is a Sampled Grating Distributed Bragg Reflector (SB-DBR) tuneable laser diode and the controller includes a processor programmed to follow the tuneability mapping of the two or more tuning section and/or phase section currents or voltages, and feeds control signals to those sections suitable to give the required wavelength.

In a further subsidiary aspect, the laser is a Super Structure Grating Distributed Bragg Reflector (SSG-DBR) tuneable laser diode, and the controller includes a processor programmed to follow the tuneability mapping of the two or more tuning section and/or phase section currents or voltages, and feeds control signals to those sections suitable to give the required wavelength.

In a further subsidiary aspect, the laser is a vertical cavity filter laser and the controller includes a processor programmed to follow the tuneability mapping of the two or more tuning section and/or phase section currents or voltages, and feeds control signals to those sections suitable to give the required wavelength.

In a further subsidiary aspect, the apparatus incorporates a coolerless system associated with an optical phase lock loop (OPLL) to provide a frequency referenced coolerless laser diode.

In a further subsidiary aspect, the apparatus incorporates a coolerless system associated with an optical injection phase lock loop system (OIPLL) to provide a frequency referenced coolerless laser diode.

BRIEF DESCRIPTION OF THE FIGURES

Various specific embodiments of the present invention are now described, by way of example only, with reference to the accompanying drawings, in which.

DETAILED DESCRIPTION OF THE INVENTION

This invention proposes a simple and effective scheme to obtain frequency stable laser operation without active laser temperature control. The method relies on sensing the chip temperature and relating it to the tuning and/or phase section (s) electrical parameters for a given optical frequency. By mapping the frequency interdependence of up to four parameters, a simple relation can be extracted between the different parameters involved. This relation is defined by the longitudinal mode jump (i.e. the output wavelength) boundaries within the mapping, which are to first order temperature independent and the linear variation of the wavelength with temperature (~0.1 nm/degree C.). Therefore, one can program current/voltage controllers from a chip temperature reading obtained via a temperature sensor (most commercial laser modules have an in-built temperature sensor) to give suitable values for the tuning and/or phase section current(s)/voltage(s) to obtain and maintain the wanted output frequency. The laser temperature is kept within its allowed maximum limit using conduction transfer through the package and normal equipment cooling.

This invention can also be associated with prior art UK Application No. 0113911.2 by C. F. C. Silva and A. J. Seeds entitled "Optical Frequency Synthesizer" in respect of frequency referencing and frequency error free systems such as Optical Phase Lock Loop (OPLL) and optical injection phase lock loop (OIPLL). The previously described systems offer a way to reference the output of the tuneable laser to a master frequency which could be provided by an optical frequency comb generator (OFCG). However in that work the tuneable laser was used with a temperature controller since the OIPLL provides stable locking only for a range of 5 degrees C. This invention in combination with either the OPLL or OIPLL scheme will provide a zero frequency error source, which can be used effectively in WDM and dense WDM (DWDM) systems, as the tuneable lasers will be coolerless.

This invention discloses a novel technique to achieve tuneable laser operation at any desired optical frequency without the need for laser temperature control. This technique is based on a simple scheme including a thermal sensor and a current/voltage control system. The invention also discloses a high performance frequency error free optical source eliminating the need for temperature control by combining the disclosed technique with prior work on optical injection phase lock loop systems.

Figure 1:
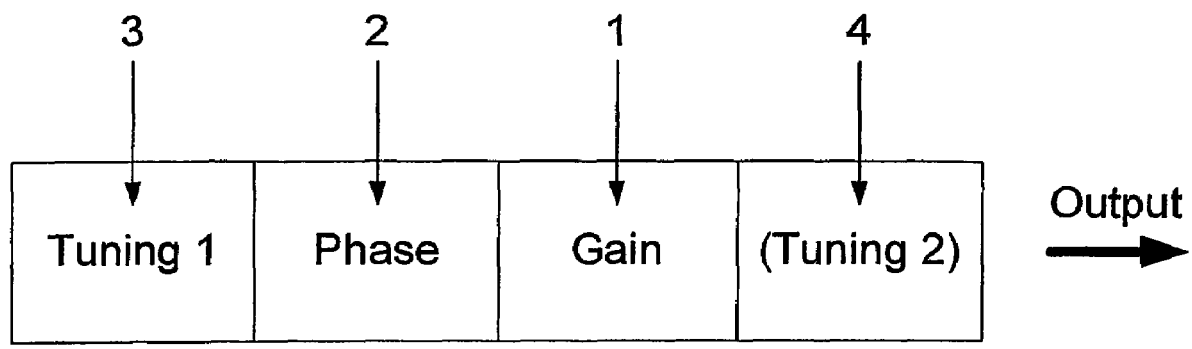
FIG. 1 shows typical three and four section tuneable laser.
Figure 2:
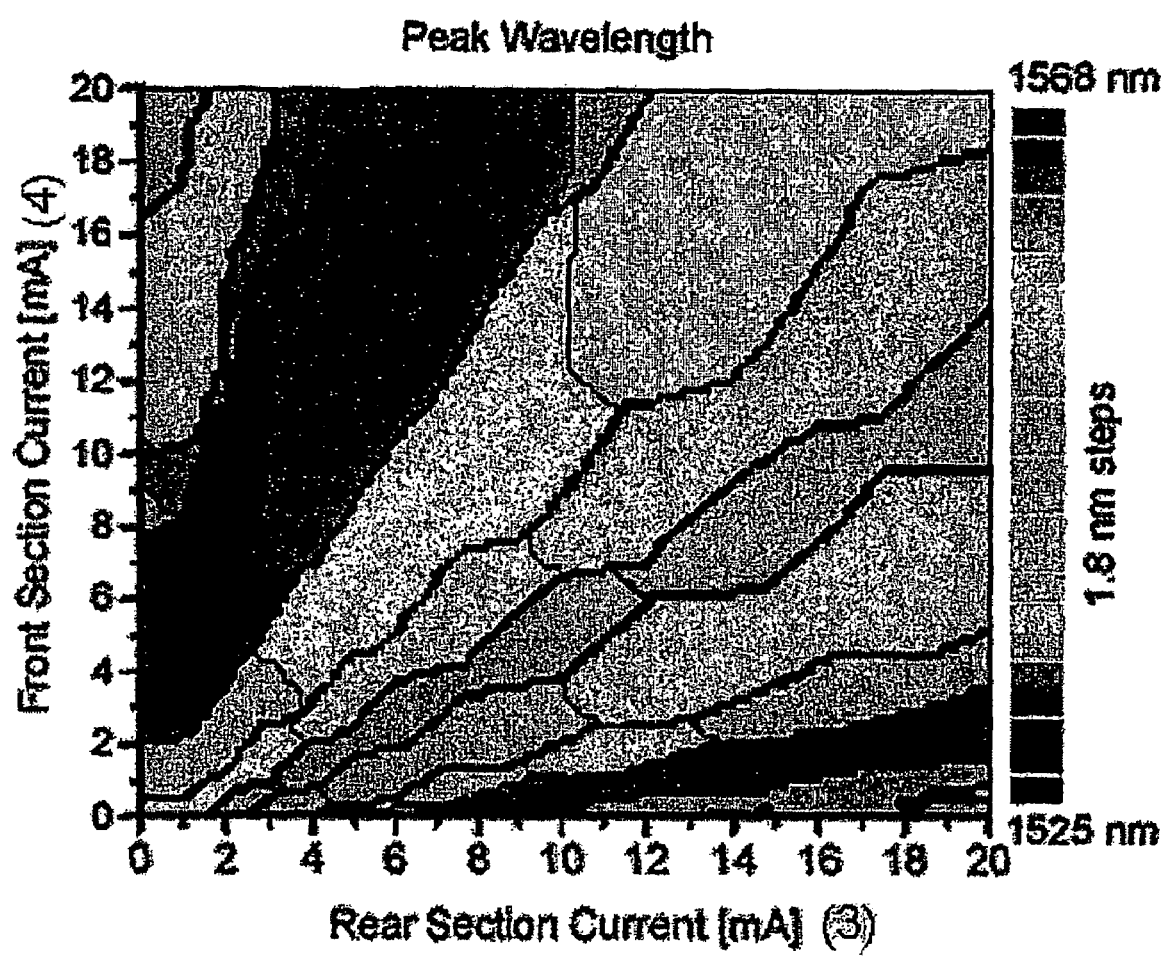
FIG. 2 shows a typical tuneability map for a four section laser at a fixed temperature.

A typical tuneable laser as shown in FIG. 1 comprises three or four sections. (1) is the gain section, (2) is the phase section, and (3) and (4) are the main tuning sections. The current on (1) controls the output power, the current or voltage on (2) controls the length of the effective Fabry-Perot cavity to adjust to the exact longitudinal mode needed, the currents/voltage on (3) and (4) adjust the wavelength to that required. A three section laser may omit one of the tuning sections (3), (4) or the phase control section (2), and in a simple DBR laser, omit one of the tuning sections (3), (4). A typical four section laser tuneable output is represented in FIG. 2. One can see the different region of tuneability over a continuous shift of the longitudinal mode. Tuning ranges of over 40 mm in wavelength are obtained for typical four section lasers.

Figure 3:
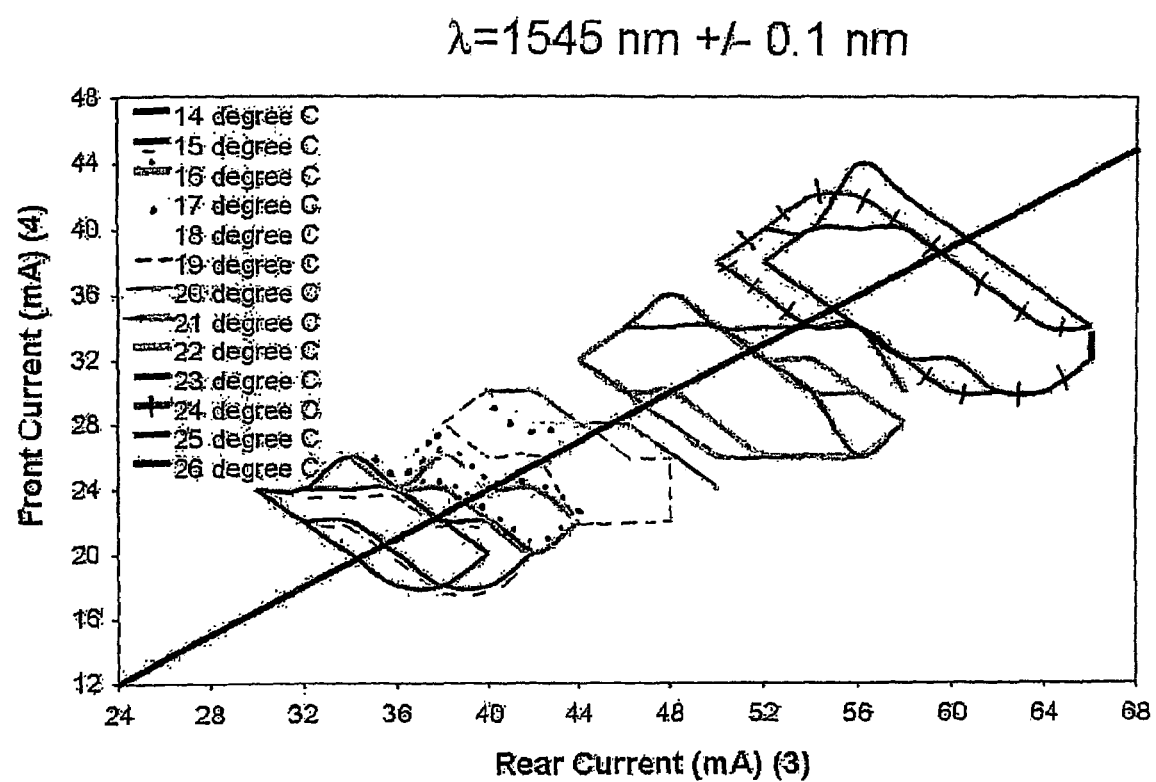
FIG. 3 shows a typical temperature dependence at a fixed wavelength for the grating section currents of a four section laser (SSG-DBR)

When the temperature of the chip changes, the output wavelength of the laser changes. For a laser with one grating section the output wavelength will change linearly with the temperature at a rate of approximately 0.1 nm/degree C., the variation being continuous if there is no other reflector forming part of the lasing cavity or discontinuous if there is such a reflector. The output wavelength also changes linearly with the current/voltage applied to the grating section. For a laser with two grating sections the output wavelength still changes linearly with the chip temperature at the same rate of approximately 0.1 mm/degree C. However, this time the wavelength is linked with the grating section currents/voltage by the map shown in FIG. 2, but the mode jump boundaries (where the wavelength changes are large) of the mapping do not change to first order, meaning that the zones of stable longitudinal mode (no mode jump) are unchanged with the chip temperature. An important feature of this invention is the use of this property to simplify the computation of the required current/voltage changes for the tuning section(s) and/or the phase section to give the required wavelength independently of the laser temperature. To be more precise, by way of example, FIG. 2 shows zones that are represented by almost linear areas going from low slope to high slope. A program could first determine in which zone the laser is operating by reading the current/voltage applied to the tuning sections, then trends are assigned to determine the variation of the different currents with the temperature knowing that the wavelength will change at an approximate rate of 0.1 nm/degree C. At that point the program will just read the laser temperature and change the current/voltage applied to the tuning sections and or phase section using the trends assigned previously. This will give, for a given wavelength, an interdepedence as seen in the example of FIG. 3.

Figure 4:
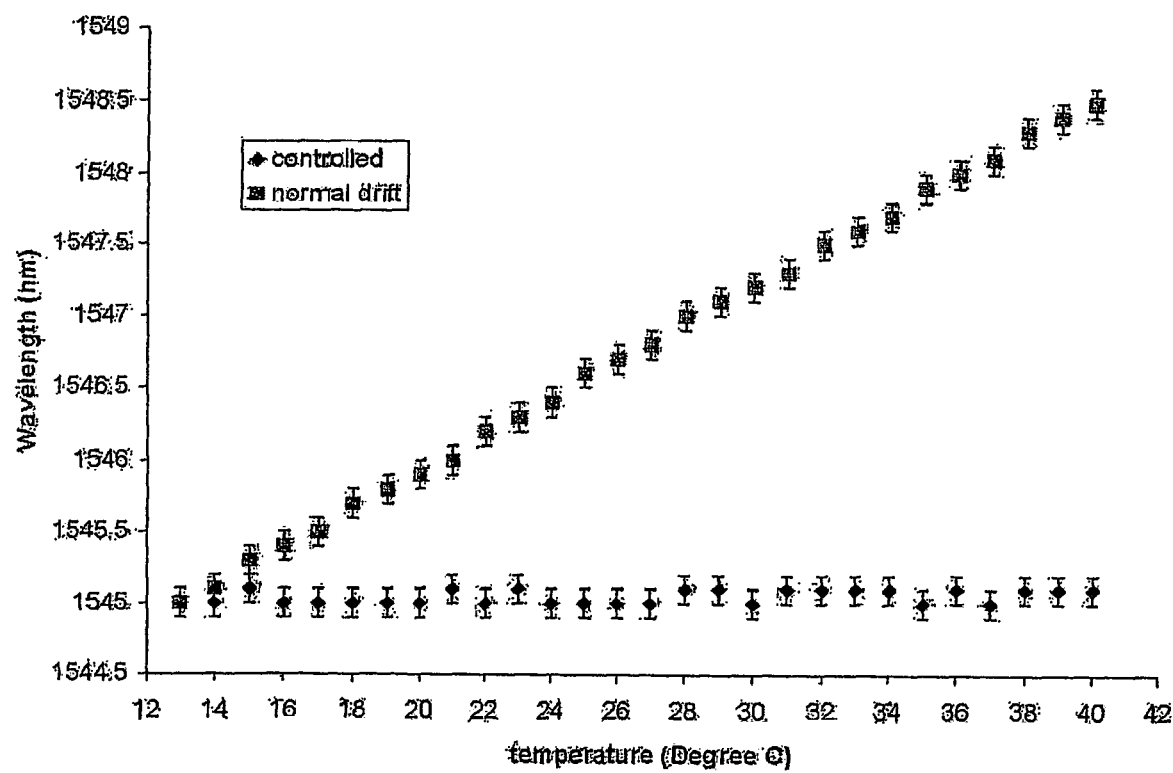
FIG. 4 shows the stability results for a four section laser (SG-DBR or SSG-DBR) when the laser temperatures is varied over the range from 15° C. to 40° C. in comparison with the stability results when the invention is not used.
Figure 5:
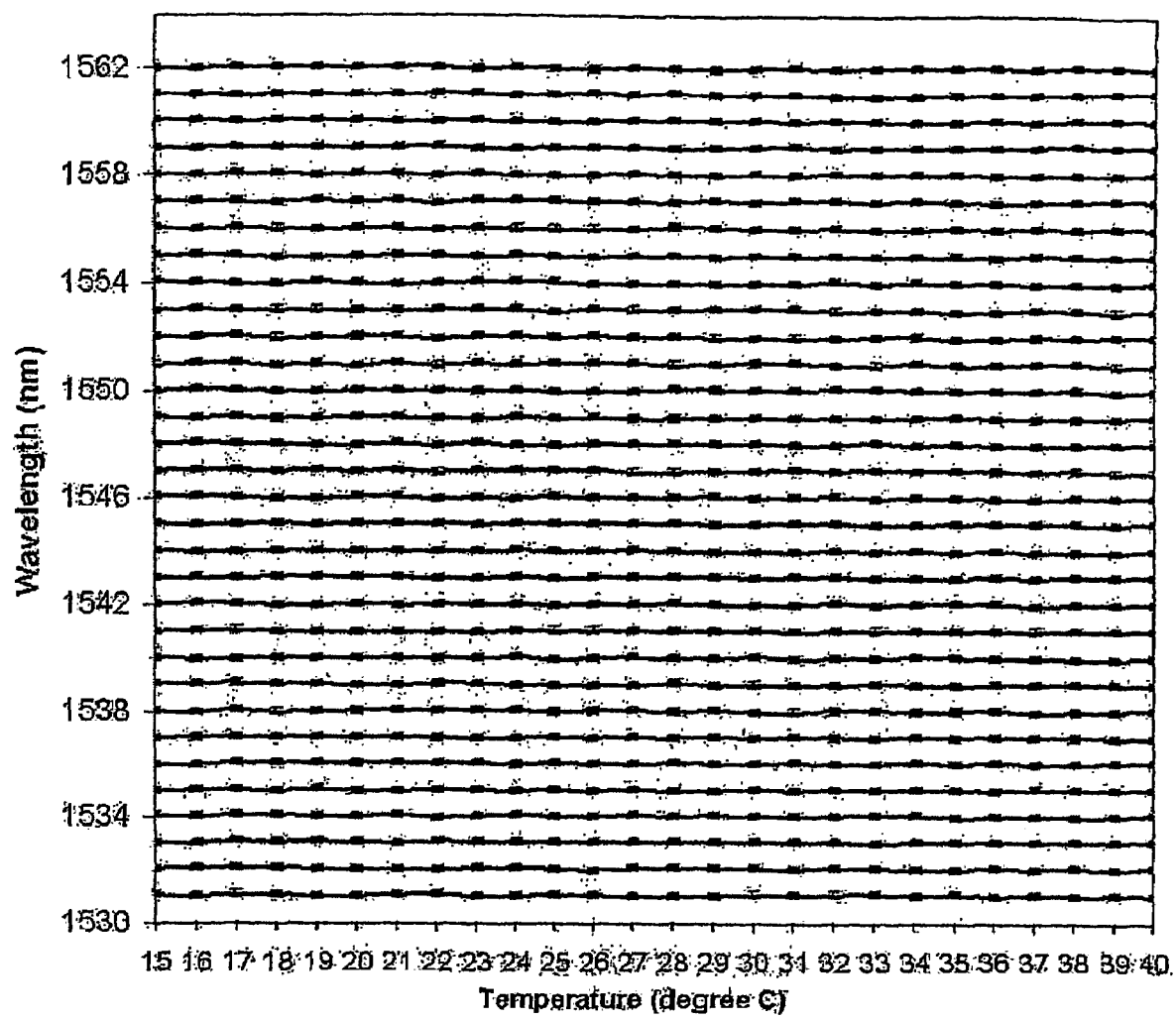
FIG. 5 shows the stability when the laser temperature is varied over the range from 15° C. to 40° C. for a four section laser (SG-DBR or SSG-DBR) for 32 different wavelengths.

By way of example, the process could be applied to a four section laser SG-DBR or SSG-DBR using quadratic trend, such as $y=0.06x^2+0.1661x+21.629$ for the front grating, $Y=0.0193x^2+0.0606x+17.467$ for the rear grating, and $y=0.1059x^2-2.5997x+15.917$ for the phase section. Such trend will result in the stability (without mode jump) shown in FIGS. 4 and 5 (for 32 different wavelengths) for temperature changes from 13 to 40 degrees C.: less than 0.1 nm drift compared to the 3 nm drift expected for this temperature shift. Note that the temperature range over which stability is demonstrated was set by the permissible operating temperature range of the particular laser used, not by the method of the invention.

Figure 6:
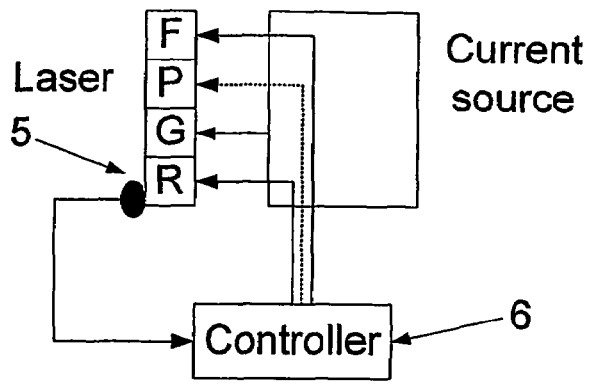
FIG. 6 shows a simple scheme to control the output wavelength as a function of the chip temperature for a three or a four section laser.

FIG. 6 illustrates the invention. The system for laser frequency control shown in FIG. 6 includes a thermal sensor (5) (often included in the laser package) and a microprocessor (6) or analogue controller to derive control currents/voltages for the laser based on the sensed temperature and required wavelength. To be more specific, in this invention, the controller outputs will depend on the correction needed. For a four section laser diode, the correction could be a program based on the linear dependence between wavelength and temperature and the mapping of wavelength dependence for the two tuning section currents/voltage. This could be associated with filtering to remove any rapidly changing signal (the temperature changes are usually slow (μs) in time). For a single tuning section laser the controller uses the slopes of the wavelength-temperature-current/voltage characteristics and a filter could be added to remove any rapidly changing signal.

Figure 7:
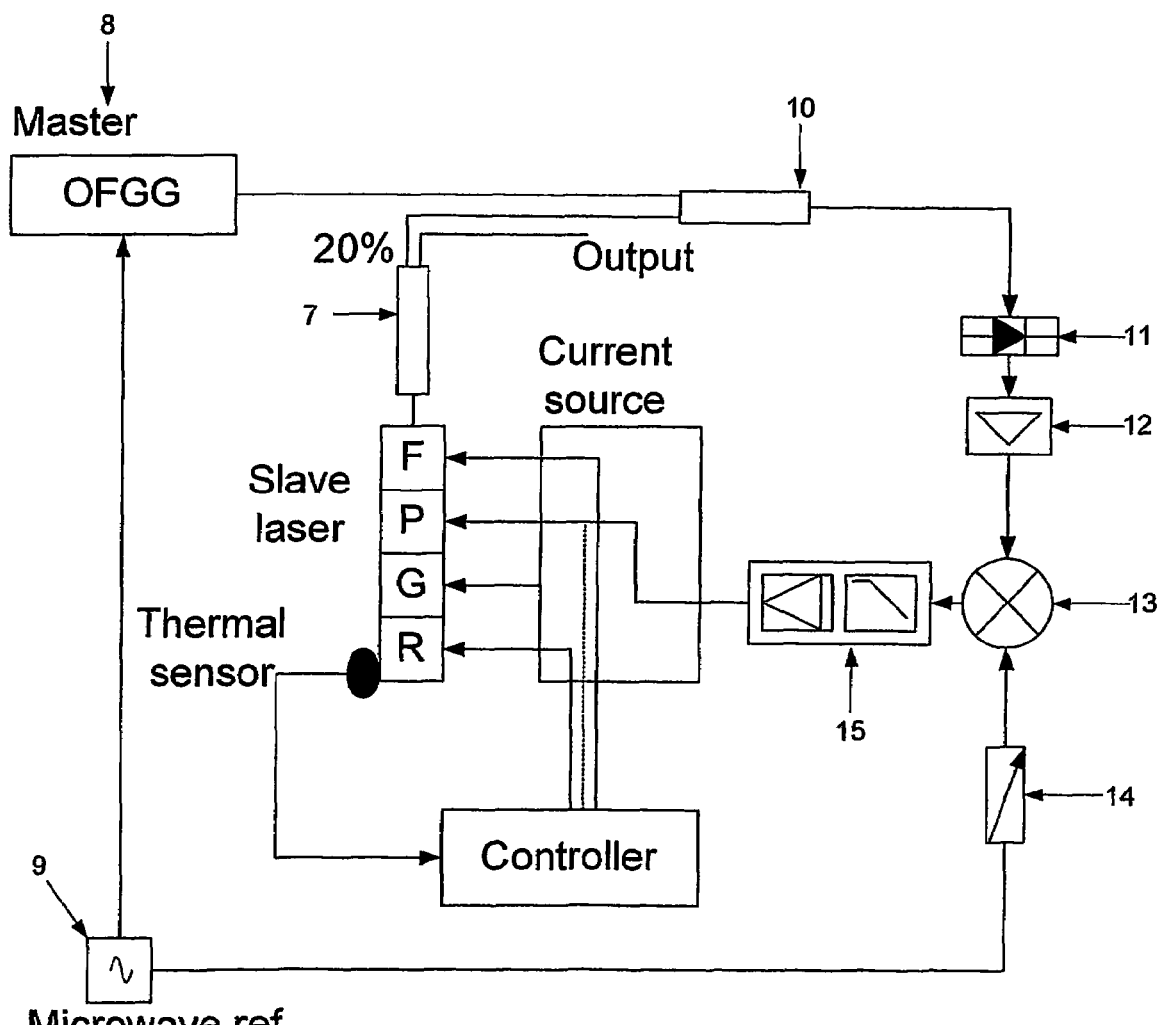
FIG. 7 shows a simple scheme to control the output wavelength as a function of the chip temperature for a three or four section laser.

FIG. 7 shows the association of the wavelength control and the OPLL to obtain a frequency referenced laser. The OPLL system comprises a coupler (7) to take part of the output of the slave laser, a master source Optical Frequency Comb Generator (OFCG) (8), which is driven by a microwave reference source (9). The outputs of the master laser and part of the output of the slave laser are combined in a coupler (10) and then detected by a photodiode (11). The resulting heterodyne signal is then amplified (12) and sent to a mixer (13), which also receives the microwave reference (9) signal with phase matched by a delay line (14). The resultant signal is then sent to the control circuit (15) which will feed the slave laser current/voltage source. The slave laser will be the coolerless wavelength control system described previously. Such systems will provide output frequencies exactly determined by the reference signals and the master comb generator can feed a multi-coolerless source system (only the master laser needs to be stable with temperature).

Figure 8:
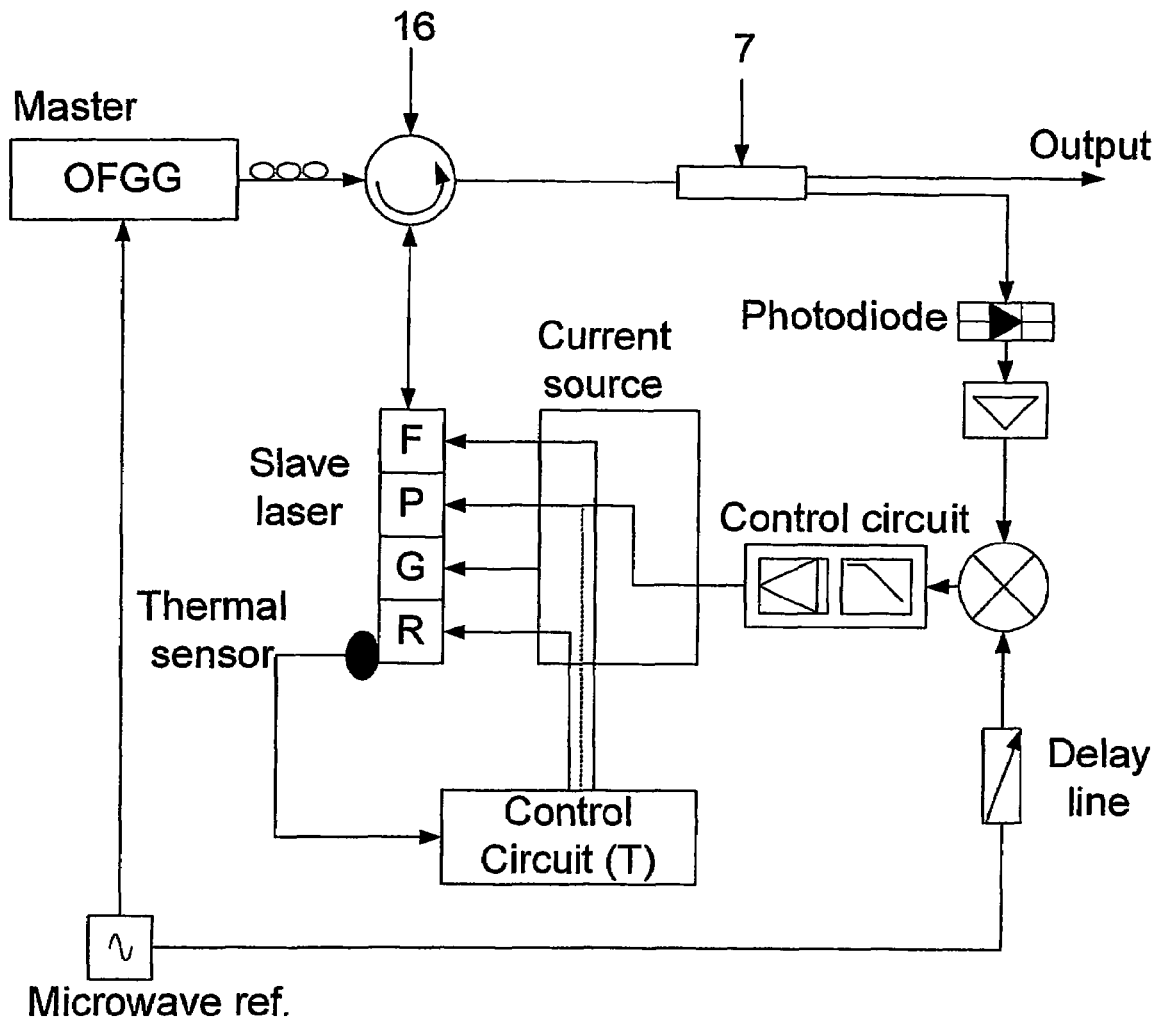
FIG. 8 shows the inclusion of the control scheme into a phase lock loop scheme to give a referenced optical frequency output without any temperature control.

FIG. 8 shows the association of the wavelength control system and the OIPLL to obtain a frequency-referenced laser without the phase lock loop delay restrictions of the previously described system. The OIPLL comprises an OIL (optical injection locked) laser plus a phase lock loop as described above. In the OIL the output of the master goes to an optical circulator (16) to be sent to the slave laser (for the optical injection). The output of the slave laser (combined with part of the output of the master laser) goes back to the circulator. The output of the circulator is then sent to a coupler (7). The low power output from the coupler is then sent to the PLL system described previously. Such a system provides a highly stable referenced laser with fast locking and coolerless operation.

The invention claimed is:

1. A tuneable laser apparatus comprising:
   a tuneable laser;
   a thermal sensor to sense a laser temperature of said tuneable laser; and
   a controller that controls at least one of a tuning section, a phase section, a tuning section current, a tuning section voltage, a phase section current and a phase section voltage, and incorporates an adjusting device which adjusts at least one of the tuning section, the phase section, the tuning section current, the tuning section voltage, the phase section current and the phase section voltage based on a required operating value of an output wavelength of the tuneable laser the depends on temperature and at least one of the tuning section current, the tuning section voltage, the phase section current and the phase section voltage, whereby the output wavelength is kept at the operating value without a substantial mode jump independent of the sensed temperature of operation within an operative range of the tuneable laser.

2. The tuneable laser apparatus according to claim 1, comprising no closed loop laser temperature control device.

3. The tuneable laser apparatus according to claim 1, further comprising a low pass filter for removing rapidly changing signals in the at least one of the tuning section current, the tuning section voltage, the phase section current and the phase section voltage.

4. The tuneable laser apparatus according to claim 1, wherein the tuneable laser is a Distributed Bragg Reflector (DBR) tuneable laser diode.

5. The tuneable laser apparatus according to claim 1, wherein the tuneable laser is a Distributed Feed Back (DFB) tuneable laser diode.

6. The tuneable laser apparatus according to claim 1, wherein the tunable laser is a Sampled Grating Distributed Bragg Reflector (SG-DBR) tuneable laser diode and the controller includes a processor programmed to follow a tuneability mapping of at least two of the tuning section current, the tuning section voltage, the phase section current and the phase section voltage and feeds control signals to at least one of the tuning section and the phase section gives a required wavelength.

7. The tuneable laser apparatus according to claim 1, wherein the tuneable laser is a Super Structure Grating Distributed Bragg Reflector (SSG-DBR) tuneable laser diode and the controller includes a processor programmed to follow a tuneability mapping of at least two of the tuning section current, the tuning section voltage, the phase section current and the phase section voltage and feeds control signals to at least one of the tuning section and the phase section that gives a required wavelength.

8. The tuneable laser apparatus according to claim 1, wherein the laser is a vertical cavity filter laser and the controller includes a processor programmed to follow a tuneability mapping of at least two of the tuning section current, the tuning section voltage, the phase section current and the phase section voltage, and feeds control signals to at least one of the tuning section and the phase section that gives a required wavelength.

9. The tuneable laser apparatus according to claim 1, wherein the apparatus incorporates a coolerless system associated with an optical phase lock loop (OPLL) to provide a frequency referenced coolerless tuneable laser diode.

10. The tunable laser apparatus according to claim 1, wherein the apparatus incorporates a coolerless system associated with an optical injection phase lock loop system (OIPLL) to provide a frequency referenced coolerless tuneable laser diode.

11. A tuneable laser apparatus comprising:
    a tuneable laser comprising at least one of a tuning section, a phase section and a gain section, wherein the at least one of the tuning section, the phase section and the gain section is operable for determining tuning characteristics of the tuneable laser according to a respective current or voltage applied thereto;
    a thermal sensor arranged to sense a laser temperature of said tuneable laser; and
    a controller for maintaining an output wavelength of the laser at a required operating value independent of the laser temperature,
    wherein the controller is arranged to:
    receive the laser temperature as an input value;
    determine the respective current or voltage to be applied to the at least one of the tuning section, the phase section and the gain section, based on the laser temperature and a predetermined trend that is a relation between the determined current or voltage and the laser temperature for the required output wavelength, wherein the relation is defined by longitudinal mode jump boundaries within a mapping of wavelength interdependence of the determined current or voltage, whereby the output wavelength of the laser is maintained at the required operating value without a substantial mode jump; and
    change the respective current or voltage applied to the at least one of the tuning section, the phase section and the gain section to maintain the output wavelength of the tuneable laser at the required operating value without a substantial mode jump.

12. The tuneable laser apparatus according to claim 11, wherein, for a specified output wavelength value, the controller is arranged to receive the laser temperature as a sole variable input value.

13. The tuneable laser apparatus according to claim 11, wherein, for a required output wavelength value, the relation is a function solely of temperature.

14. The tuneable laser apparatus according to claim 11, wherein the predetermined trend is a quadratic relation.

15. The tuneable laser apparatus according to claim 11, wherein the relation is defined by longitudinal mode jump boundaries of a mapping of output wavelength with respect to the respective current or voltage applied to at least two of the tuning section, the phase section and the gain section.

16. The tuneable laser apparatus according to claim 15, wherein the relation is further defined by a linear variation of output wavelength with temperature.

17. The tuneable laser apparatus according to claim 11, comprising no closed loop laser temperature control device.

18. The tuneable laser apparatus according to claim 11, wherein the tuneable laser is a Distributed Bragg Reflector (DBR) tuneable laser diode.

19. The tuneable laser apparatus according to claim 11, wherein the tuneable laser is a Distributed Feed Back (DFB) tuneable laser diode.

20. The tuneable laser apparatus according to claim 11, wherein the tuneable laser is a Sampled Grating Distributed Bragg Reflector (SG-DBR) tuneable laser diode and the controller includes a processor programmed to follow a tuneability mapping of at least two of the tuning section current, the tuning section voltage, the phase section current and the phase section voltage, and feeds control signals to the at least one of the tuning section, the phase section and the gain section that gives a required wavelength.

21. The tuneable laser apparatus according to claim 11, wherein the tuneable laser is a Super Structure Grating Distributed Bragg Reflector (SSG-DBR) tuneable laser diode and the controller includes a processor programmed to follow a tuneability mapping of at least two of the tuning section current, the tuning section voltage, the phase section current and the phase section voltage, and feeds control signals to the at least one of the tuning section, the phase section and the gain section gives a required wavelength.

22. The tuneable laser apparatus according to claim 11, wherein the tuneable laser is a vertical cavity filter laser and the controller includes a processor programmed to follow a tuneability mapping of at least two of the tuning section current, the tuning section voltage, the phase section current and the phase section voltage, and feeds control signals to the at least one of the tuning section, the phase section and the gain section that gives a required wavelength.

23. The tuneable laser apparatus according to claim 11, wherein the apparatus incorporates a coolerless system associated with an optical phase lock loop (OPLL) to provide a frequency referenced coolerless tuneable laser diode.

24. The tuneable laser apparatus according to claim 11, wherein the apparatus incorporates a coolerless system associated with an optical injection phase lock loop system (OIPLL) to provide a frequency referenced coolerless tuneable laser diode.

* * * * *